United States Patent
Zommer

(10) Patent No.: US 11,296,017 B2
(45) Date of Patent: Apr. 5, 2022

(54) THIN PROFILE POWER SEMICONDUCTOR DEVICE PACKAGE HAVING FACE-TO-FACE MOUNTED DICE AND NO INTERNAL BOND WIRES

(71) Applicant: Littelfuse, Inc., Chicago, IL (US)

(72) Inventor: Nathan Zommer, Fort Lauderdale, FL (US)

(73) Assignee: Littelfuse, Inc., Chicago, IL (US)

( * ) Notice: Subject to any disclaimer, the term of this patent is extended or adjusted under 35 U.S.C. 154(b) by 262 days.

(21) Appl. No.: 16/783,806

(22) Filed: Feb. 6, 2020

(65) Prior Publication Data
US 2020/0176367 A1  Jun. 4, 2020

Related U.S. Application Data

(62) Division of application No. 15/845,155, filed on Dec. 18, 2017, now Pat. No. 10,672,691.

(51) Int. Cl.
*H01L 23/495* (2006.01)
*H01L 29/10* (2006.01)

(52) U.S. Cl.
CPC .. *H01L 23/49575* (2013.01); *H01L 23/49524* (2013.01); *H01L 23/49562* (2013.01); *H01L 29/1095* (2013.01)

(58) Field of Classification Search
CPC ......... H01L 23/49575; H01L 23/49524; H01L 23/49562; H01L 29/1095; H01L 2224/33181; H01L 23/528; H01L 23/31; H01L 24/06; H01L 24/26; H01L 24/46
See application file for complete search history.

(56) References Cited

U.S. PATENT DOCUMENTS

| | | | |
|---|---|---|---|
| 5,917,242 A | 6/1999 | Ball | |
| 9,373,566 B2 | 6/2016 | Otremba et al. | |
| 9,576,932 B2 | 2/2017 | Williams et al. | |
| 2005/0224945 A1* | 10/2005 | Saito | H01L 23/49575 257/E23.052 |
| 2007/0138606 A1* | 6/2007 | Brailey | H01L 23/49562 257/E23.044 |
| 2008/0150105 A1 | 6/2008 | Hosseini et al. | |
| 2013/0001759 A1 | 1/2013 | Kim et al. | |
| 2013/0270706 A1 | 10/2013 | Sugimura et al. | |
| 2015/0270194 A1 | 9/2015 | Otremba et al. | |

FOREIGN PATENT DOCUMENTS

JP   H05-166984 A   7/1993

\* cited by examiner

*Primary Examiner* — Benjamin Tzu-Hung Liu
(74) *Attorney, Agent, or Firm* — Kacvinsky Daisak Bluni PLLC

(57) ABSTRACT

A packaged semiconductor device has a thin profile, two face-to-face mounted power semiconductor device dice, and no internal bond wires. A first semiconductor device die is mounted so that a gate pad is bonded to the bottom of a first lead, and so that a source pad is bonded to the bottom of a second lead. A second semiconductor device die identical to the first is mounted so that a gate pad is bonded to the top of the first lead, and so that a source pad is bonded to the top of the second lead. The backside drain electrodes of both dice are electrically coupled to a third lead. The third lead in one example has a forked-shape, and the two dice are disposed entirely between the two tines of the fork. After encapsulation, the three leads extend parallel to each other from a body portion of the package.

7 Claims, 7 Drawing Sheets

BEND/CLAMP FORK-SHAPED DRAIN LEAD ONTO THE ASSEMBLY OF FIG. 11 AND SOLDER
(SIDE VIEW)

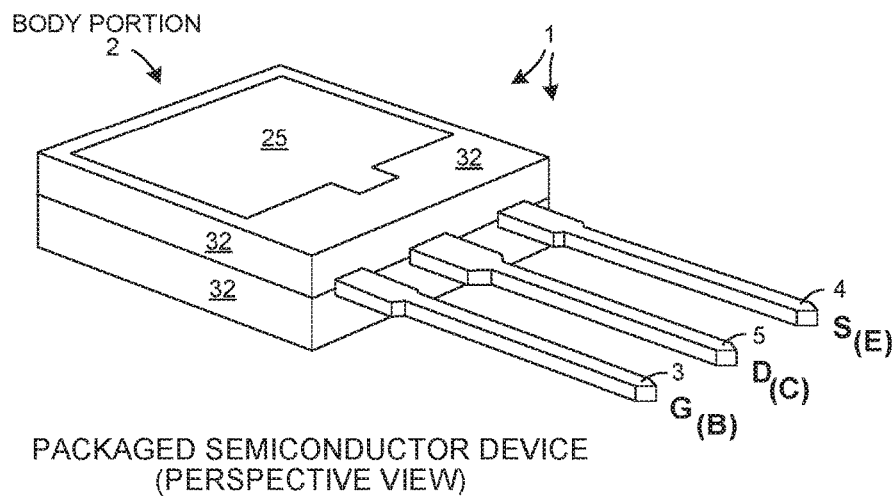
PACKAGED SEMICONDUCTOR DEVICE
(PERSPECTIVE VIEW)
FIG. 1
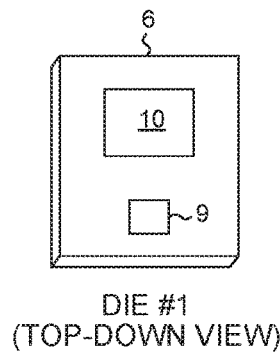
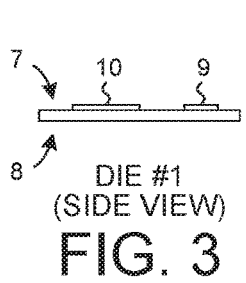
DIE #1
(TOP-DOWN VIEW)
FIG. 2
DIE #1
(SIDE VIEW)
FIG. 3
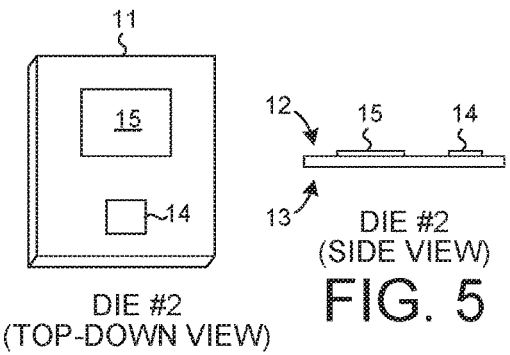
DIE #2
(TOP-DOWN VIEW)
FIG. 4
DIE #2
(SIDE VIEW)
FIG. 5
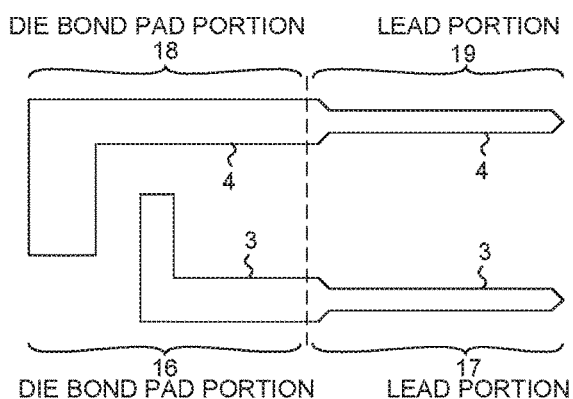
GATE AND SOURCE LEADS
(TOP-DOWN VIEW)
FIG. 6
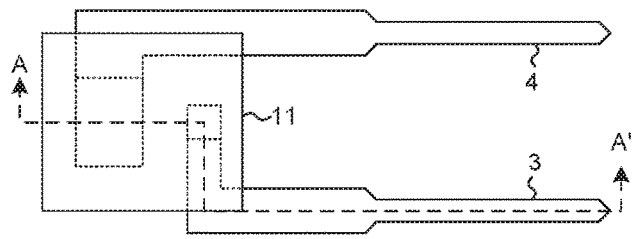
DICE ATTACHED TO GATE
AND SOURCE LEADS
(TOP-DOWN VIEW)
FIG. 7

DICE ATTACHED TO TOP AND BOTTOM OF THE GATE AND SOURCE LEADS (CROSS-SECTIONAL VIEW)

FORK-SHAPED DRAIN LEAD ASSEMBLY (SIDE VIEW)

FORK-SHAPED DRAIN LEAD ASSEMBLY (TOP-DOWN VIEW)

ADD SOLDER PREFORMS TO THE ASSEMBLY OF FIG. 8 (CROSS-SECTIONAL VIEW)

FLARE FORK-SHAPED DRAIN LEAD (SIDE VIEW)

INSERT THE ASSEMBLY OF FIG. 11 INTO THE FLARED FORK-SHAPED DRAIN LEAD (CROSS-SECTIONAL VIEW)

BEND/CLAMP FORK-SHAPED
DRAIN LEAD ONTO THE ASSEMBLY
OF FIG. 11 AND SOLDER
(SIDE VIEW)

FORK-SHAPED DRAIN LEAD WITH
ASSEMBLY OF FIG. 11 INSERTED
(TOP-DOWN VIEW)

ENCAPSULATE
(TOP-DOWN VIEW)

ENCAPSULATE
(SIDE VIEW)

DRAIN LEAD
(TOP-DOWN VIEW)

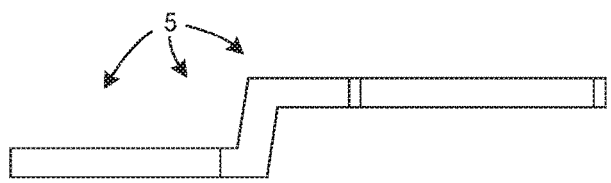

DRAIN LEAD
(SIDE VIEW)

FIG. 20

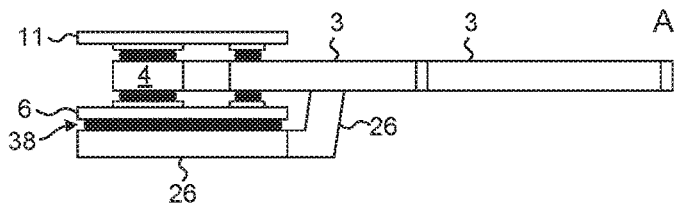

ASSEMBLY OF FIG. 8 IS ATTACHED
TO THE DRAIN LEAD
(SIDE VIEW)

FIG. 21

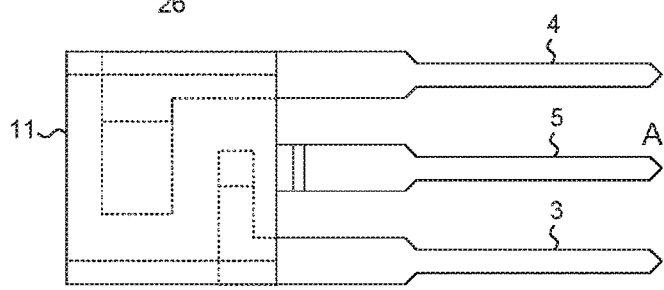

ASSEMBLY OF FIG. 8 IS ATTACHED
TO THE DRAIN LEAD
(TOP-DOWN VIEW)

FIG. 22

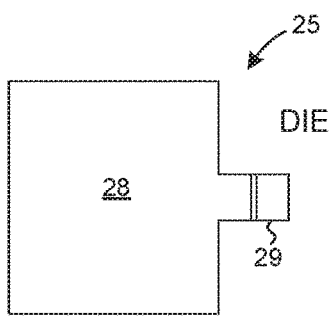

DIE BACKSIDE CONTACT MEMBER
(TOP-DOWN VIEW)

FIG. 23

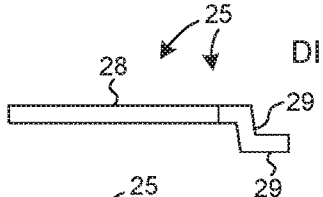

DIE BACKSIDE CONTACT MEMBER
(SIDE VIEW)

FIG. 24

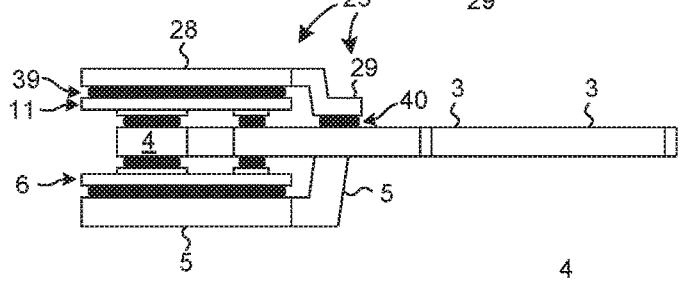

THE DIE BACKSIDE CONTACT
MEMBER IS SOLDERED DOWN
ONTO THE G/S DIE ASSEMBLY
(SIDE VIEW)

FIG. 25

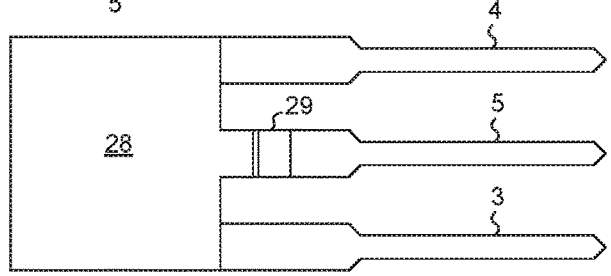

THE DIE BACKSIDE CONTACT
MEMBER IS SOLDERED DOWN
ONTO THE G/S DIE ASSEMBLY
(TOP-DOWN VIEW)

FIG. 26

ENCAPSULATE
(TOP-DOWN VIEW)

ENCAPSULATE
(SIDE VIEW)

TOP DIE BACKSIDE
CONTACT MEMBER
(TOP-DOWN VIEW)

TOP DIE BACKSIDE
CONTACT MEMBER WITH
DIE #2 ATTACHED
(TOP-DOWN VIEW)

TOP DIE BACKSIDE
CONTACT MEMBER
(SIDE VIEW)

DIE #2 ATTACHED TO THE TOP DIE
BACKSIDE CONTACT MEMBER
(SIDE VIEW)

DIE #1 ATTACHED TO THE BOTTOM
DIE BACKSIDE CONTACT MEMBER
(SIDE VIEW)

THE FRAME OF TOP DIE BACKSIDE CONTACT MEMBERS
(THE FRAME OF BOTTOM DIE BACKSIDE CONTACT MEMBERS IS IDENTICAL)

THE LEADFRAME

FRAMES OF TOP AND BOTTOM DIE BACKSIDE CONTACT
MEMBERS ARE SANDWICHING THE LEADFRAME FROM THE
TOP AND BOTTOM - READY FOR SOLDERING
(TOP-DOWN VIEW)

THE FRAMES OF THE TOP AND BOTTOM DIE BACKSIDE
CONTACT MEMBERS ARE CLAMPED TO THE LEADFRAME
(SIDE VIEW)

ENCAPSULATE
(TOP-DOWN VIEW)

ENCAPSULATE
(SIDE VIEW)

PACKAGED SEMICONDUCTOR DEVICE
(PERSPECTIVE VIEW)

THIN PROFILE POWER SEMICONDUCTOR DEVICE PACKAGE HAVING FACE-TO-FACE MOUNTED DICE AND NO INTERNAL BOND WIRES

CROSS REFERENCE TO RELATED APPLICATION

This application is a divisional of, and claims the benefit of priority to, U.S. patent application Ser. No. 15/845,155, filed Dec. 18, 2017, entitled "THIN PROFILE POWER SEMICONDUCTOR DEVICE PACKAGE HAVING FACE-TO-FACE MOUNTED DICE AND NO INTERNAL BONDWIRES," which application is incorporated herein by reference in its entirety.

TECHNICAL FIELD

The described embodiments relate generally to power semiconductor packaging, and to related structures and methods.

BACKGROUND INFORMATION

There are several known three-lead semiconductor device packages for discrete power Insulated Gate Bipolar Transistor (IGBT) and Field Effect Transistor (MOSFET) devices, including the TO-220, TO-240, TO-247 packages. In a typical "TO" type package, the backside of the semiconductor die is soldered to the heatsink of the package. The heatsink is typically a copper slug, tab or plate, that is an extension part of one of the leads. The top surface of the semiconductor die is typically connected via metal bondwires to the metal leads. The die portion of the assembly is then overmolded with an amount of encapsulant to form the body portion of the package. The three leads extend from the body portion parallel to each other. These packages are popular, and work well in their intended environments.

SUMMARY

Despite the fact that standard "TO" type semiconductor device packages, such as a TO-247 package, are thought to work well in many environments, improvements can be made. In certain power switching environments it is desirable to have a switch that conducts only short pulses of very high current. One such pulse can, for example, have a duration of one microsecond to two hundred microseconds. The current conducted by the switch during such a pulse can be from one thousand amperes to eight thousand amperes. To achieve this, the switch should have a high transconductance gain. In the case of the switch being an IGBT device, high transconductance means that when a small gate voltage is applied to the gate (in the range of five volts) a large current (in the range of five thousand amperes) flows through the switch. Two face-to-face semiconductor device dice can be provided in the package. Due to the current flowing only a small amount of the time, total energy dissipated in the package can be absorbed by the two semiconductor dice themselves without the devices overheating. Accordingly, there is no need for a thick metal die-attach plug or die-mounting tab within the package. As a result, a "TO" style package that has a relatively thin profile is provided, but yet the package includes two IGBT dice rather than just one.

A novel packaged semiconductor device is disclosed. The novel packaged semiconductor device has a thin profile, two face-to-face mounted semiconductor device dice, and no internal bondwires. The novel packaged semiconductor device includes a body portion, a first lead, a second lead a third lead, a first semiconductor device die and a second semiconductor device die. The first, second, and third leads extend from the body portion parallel to one another. The first semiconductor device die, which may be an IGBT or MOSFET, has a front side and a backside. A gate pad and a source pad are disposed on the front side of the first semiconductor device die. The backside surface of the first semiconductor device die is a drain electrode. The second semiconductor device die is identical to the first semiconductor device die. The second semiconductor device die has a front side and a backside. A gate pad and a source pad are disposed on the front side of the second semiconductor device die. The backside surface of the second semiconductor device die is a drain electrode.

In the case of the two semiconductor device dice being IGBTs, the control lead is typically called the base lead, the other top surface lead is typically called the emitter lead, and the backside electrode is typically called the collector electrode. In the case of the two semiconductor device dice being MOSFETs, the control lead is typically called the gate lead, the other top surface lead is typically called the source lead, and the backside electrode is typically called the drain electrode. Because the presently described novel packaged semiconductor device can include either type of semiconductor device, the terms "gate", "source" and "drain" are used in this patent document. It is to be understood that the term "gate" in this context can refer to either the gate of a MOSFET die, or to the base of an IGBT die. It is to be understood that the term "source" in this context can refer to either the source of a MOSFET die, or to the emitter of an IGBT die. It is to be understood that the term "drain" in this context can refer to either the drain of a MOSFET die, or to the collector of an IGBT die.

The first lead has a die bond pad portion and a lead portion. The entire first lead (including its die bond pad portion and its lead portion) has a uniform thickness that is less than one millimeter. Likewise, the second lead has a die bond pad portion and a lead portion. The entire second lead (including its die bond pad portion and its lead portion) has the same uniform thickness of less than one millimeter. This uniform thickness is the thickness of a typical lead, and is thinner than the thickness of a typical thick die-attach slug or die-attach tab within a typical TO-247 package.

The front side of the first semiconductor device die is bonded to the first and second leads such that the gate pad is bonded to the die bond pad portion of the first lead, and such that the source pad is bonded to the die bond pad portion of the second lead. The front side of the second semiconductor device die is bonded to the first and second leads such that the gate pad is bonded to the die bond pad portion of the first lead, and such that the source pad is bonded to the die bond pad portion of the second lead. In this way, the first and second semiconductor device dice are bonded such that the front sides of the first and second semiconductor device dice face each other with the die bond pad portions of the first and second leads being disposed therebetween.

The drain electrode on the backside of the first semiconductor device die is electrically coupled to a lead portion of the third lead. The drain electrode on the backside of the second semiconductor device die is electrically coupled to the lead portion of the third lead. An amount of insulative encapsulant is provided such that the die bond pad portions of the first and second leads, the first and second semiconductor device dice, and the amount of encapsulant together form a part of the body portion of the packaged semiconductor device.

There are multiple ways that the drain electrodes on the backsides of the first and second semiconductor device dice can be electrically coupled to the lead portion of the third lead. In one example, the third lead has a forked-shape, and includes a lead portion, a first tine portion, and a second tine portion. The backside drain electrode surface of the first semiconductor device die is bonded to an inside die attach surface of the first tine portion. The backside drain electrode surface of the second semiconductor device die is bonded to an inside die attach surface of the second tine portion. The first and second semiconductor device dice are bonded such that they both are disposed entirely between the first and second tine portions of the third lead.

In another example, the third lead is a stamped piece of sheet metal that is bent in a leadforming/stamping operation. A die bond pad portion of the third lead is bent down so that its die attach surface is vertically displaced with respect to the elongated lead portion of the third lead. The backside drain electrode surface of the first semiconductor device die is bonded to a die attach surface of the die bond pad portion of the third lead. The backside drain electrode of the second semiconductor device die is electrically coupled to the lead portion of the third lead by a die backside contact member. The die backside contact member in one example is a bent piece of sheet metal. A planar die attach surface of the die backside contact member is bonded to the backside of the first semiconductor device die. A foot portion of the die backside contact member is bonded to the lead portion of the third lead.

In another example, two die backside contact members are employed. A first die backside contact member has a planar die attach surface that is bonded to the backside of the first semiconductor device die. The first die backside contact member has a foot portion that is bonded to the lead portion of the third lead. A second die backside contact member has a planar die attach surface that is bonded to the backside of the second semiconductor device die. The second die backside contact member has a foot portion that is bonded to the lead portion of the third lead. Both the first and second semiconductor device dice are disposed entirely between the first and second die backside contact members.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 1 is a perspective diagram of a first embodiment of a packaged semiconductor device.

FIG. 2 is a top-down diagram a first semiconductor device die of the first embodiment.

FIG. 3 is a side view diagram of the first semiconductor device die of FIG. 2.

FIG. 4 is a top-down diagram of a second semiconductor device die of the first embodiment.

FIG. 5 is a side view diagram of the second semiconductor device die of FIG. 4.

FIG. 6 is a top-down diagram of the first and second leads of the first embodiment.

FIG. 7 is a top-down diagram that illustrates how the first and second dice are bonded to the first and second leads.

FIG. 20 is a side view diagram of the third lead of FIG. 19.

FIG. 21 is a side view diagram of a G/S assembly.

FIG. 22 is a top-down diagram of the G/S assembly of FIG. 21.

FIG. 23 is a top-down diagram of a die backside contact member.

FIG. 24 is a side view diagram of the die backside contact member of FIG. 23.

FIG. 25 is a side view diagram of the structure that results after the die backside contact member is soldered down onto the G/S die assembly.

FIG. 26 is a top-down diagram of the structure of FIG. 25.

DETAILED DESCRIPTION

Figure 8:
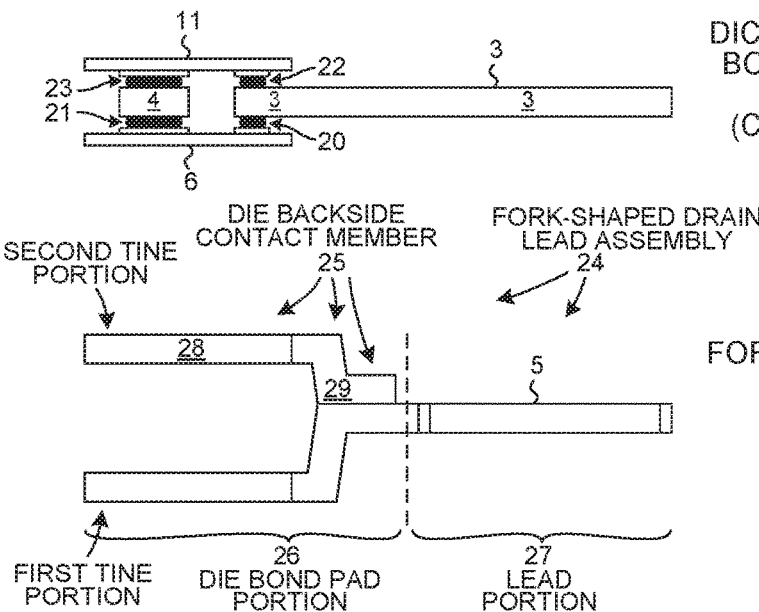
FIG. 8 is a cross-sectional diagram that illustrates how the first and second dice are bonded to the first and second leads.

Reference will now be made in detail to some embodiments of the invention, examples of which are illustrated in the accompanying drawings. In the description below, terms such as "up", "down", "vertical", "side", "front", "back", "top" and "bottom" are used herein to describe relative orientations between different parts of the structure being described, and it is to be understood that the overall structure being described can actually be oriented in any way in three-dimensional space.

FIG. 1 is a perspective diagram of packaged semiconductor device 1 in accordance with a first embodiment and first assembly method. The packaged semiconductor device 1 includes a body portion 2, a first lead 3, a second lead 4, and a third lead 5. The three leads 3, 4 and 5 extend out of the body portion 2 parallel to one another as shown. One way that the novel packaged semiconductor device 1 is made is set forth below in connection with the sequence of diagrams FIGS. 2-17.

FIG. 2 is a top-down diagram of a first semiconductor device die 6. The first semiconductor device die 6 has a front side 7 and a backside 8. Disposed on the front side 7 is a gate pad 9 and a source pad 10. These are the gate and source electrodes of the device. The entire backside 8 of the die is the drain electrode of the device. The backside of the die 6 extends in a single plane. In the present example, the first semiconductor device die is a discrete Insulated Gate Bipolar Transistor (IGBT).

FIG. 3 is a side view diagram of the first semiconductor device die 6.

FIG. 4 is a top-down diagram of a second semiconductor device die 11. The second semiconductor device die 11 has a front side 12 and a backside 13. Disposed on the front side 12 is a gate pad 14 and a source pad 15. These are the gate and source electrodes of the device. The entire backside 13 of the die is the drain electrode of the device. The backside of the die 11 extends in a single plane. In the present example, the second semiconductor device die is an IGBT die that is identical to the first semiconductor device die 6.

FIG. 5 is a side view diagram of the second semiconductor device die 11.

FIG. 6 is a top-down diagram of the first and second leads 3 and 4. The first lead 3 includes a die bond pad portion 16 and a lead portion 17. The second lead 4 includes a die bond pad portion 18 and a lead portion 19. Each of the first and second leads is a unitary piece of metal that is stamped from a leadframe of sheet metal.

FIG. 7 is a top-down diagram that illustrates how the first and second dice 6 and 11 are bonded to the first and second leads 3 and 4.

FIG. 8 is a cross-sectional diagram that illustrates how the first and second dice 6 and 11 are bonded to the first and second leads 3 and 4. The view of FIG. 8 is taken along cross-sectional line A-A' of FIG. 7. The gate pad of the first die 6 is bonded by an amount of solder 20 to the bottom of the die bond pad portion 16 of the first lead 3. The source pad of the first die 6 is bounded by an amount of solder 21 to the bottom of the die bond pad portion 18 of the second lead 4. The gate pad of the second die 11 is bonded by an amount of solder 22 to the top of the die bond pad portion 16 of the first lead 3. The source pad of the second die 11 is bounded by an amount of solder 23 to the top of the die bond pad portion 18 of the second lead 4.

Figure 9:
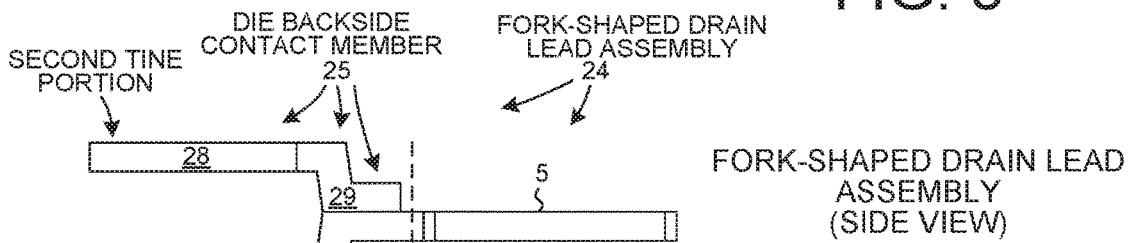
FIG. 9 is a side view diagram of a fork-shaped drain lead assembly of the first embodiment.

FIG. 9 is a side view diagram of a fork-shaped drain lead assembly 24. The fork-shaped drain lead assembly 24 includes the third lead 5 as well as a die backside contact member 25. The third lead 5 is a stamped metal lead that is stamped from the leadframe in the same way that the first and second leads 3 and 4 are stamped from the leadframe, except that the third lead 5 has a bend. The die bond pad portion 26 of the third lead has an upward-facing planar bonding surface. This planar bonding surface is in a different plane from the plane of the upper surface of the lead portion 27 of the third lead. The die backside contact member 25 likewise has a bend. The die bond pad portion 28 of the die backside contact member 25 has a planar bonding surface. This planar bonding surface is in a different plane from the plane of the upper surface of the lead portion 27 of the third lead. The die backside contact member 25 has a foot portion 29 that extends down and makes contact with the third lead 5. The die backside contact member 25 is permanently bonded to the third lead 5 as shown. The die backside contact member 25 may, for example, be spot welded to the third lead 5.

The die bond pad portion 26 is a first tine of the fork-shaped assembly 24 and the die backside contact member 25 is a second tine of the fork-shaped assembly 24. Although the third lead 5 and the member 25 are described here as two different parts that are assembled together, the entire fork-shaped assembly can be considered to be the third lead. Accordingly, the third lead can have a fork shape, and the third lead can be a single unitary piece of metal with two tines or alternatively the third lead can involve multiple pieces that are bonded together.

Figure 10:
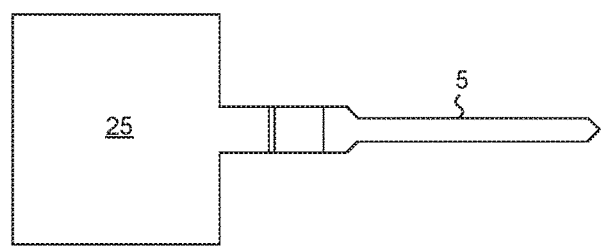
FIG. 10 is a top-down diagram of the fork-shaped drain lead assembly of FIG. 9.

FIG. 10 is a top-down diagram of the fork-shaped drain lead assembly 24.

Figure 11:
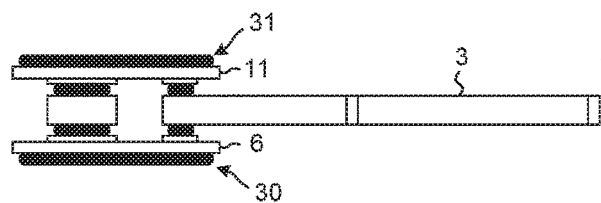
FIG. 11 is a cross-sectional diagram that illustrates how two amounts of solder are applied to the assembly of FIG. 8.

FIG. 11 is a cross-sectional diagram that illustrates how two amounts of solder 30 and 31 are applied to the assembly of FIG. 8. The amounts of solder 30 and 31 may be applied as solder paste or as solder preforms.

Figure 12:
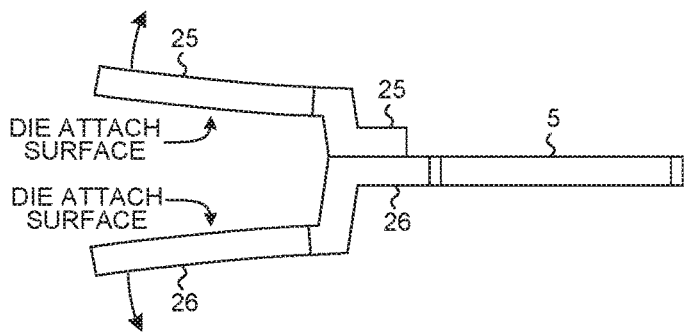
FIG. 12 is a side view diagram that shows how the fork-shaped drain lead assembly of FIG. 9 may be flared to provide a wider opening into which the assembly of FIG. 11 can be inserted.

FIG. 12 is a side view diagram that shows how the fork-shaped drain lead assembly 24 may be flared to provide a wider opening into which the assembly of FIG. 11 can be inserted.

Figure 13:
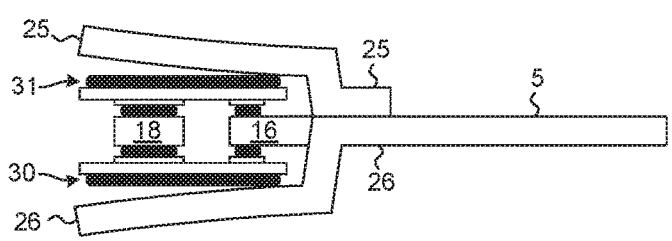
FIG. 13 is a cross-sectional diagram that illustrates the assembly of FIG. 11 inserted into the flared fork-shaped drain lead assembly of FIG. 12.

FIG. 13 is a cross-sectional diagram that illustrates the assembly of FIG. 11 inserted into the fork-shaped drain lead assembly 24 of FIG. 12. The cross-section of FIG. 13 is taken along sectional line B-B' of FIG. 15.

Figure 14:
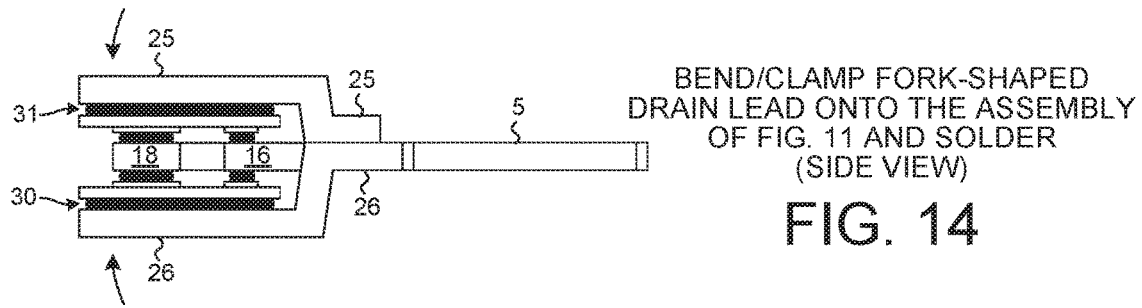
FIG. 14 is a side view diagram that shows how the fork-shaped drain lead assembly is unflared so that there is good contact between the amounts of solder and the inside planar bonding surfaces of the fork-shaped drain lead assembly.

FIG. 14 is a side view diagram that shows how the fork-shaped drain lead assembly 24 is unflared so that there is good contact between the amounts of solder 30 and 31 and the inside planar bonding surfaces of the fork-shaped drain lead assembly 24. At this point in the assembly process, the lead portions of the three leads 3-5 extend parallel to one another. The top surfaces of the lead portions of the three leads 3-5 are all disposed in the same plane. In one example, the first and second leads are parts of a first leadframe and the third lead is a part of a second lead frame. The two leadframes are temporarily held together at this point in the assembly process by a bridge member. When the constituent parts are in the positions illustrated in FIG. 14, the amounts of solder 30 and 31 are melted. The backside of the first die 6 is soldered to the inside planar bonding surface of the third lead 5. The backside of the second die 11 is soldered to the inside planar bonding surface of the die backside contact member 25.

Figure 15:
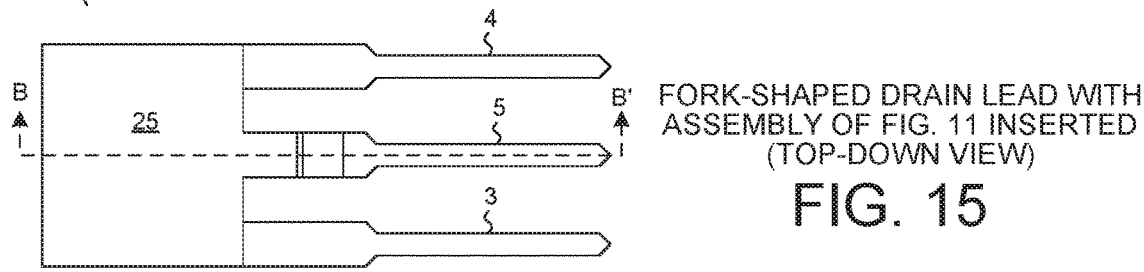
FIG. 15 is a top-down diagram of the soldered structure of FIG. 14.

FIG. 15 is a top-down diagram of the soldered structure of FIG. 14.

Figure 16:
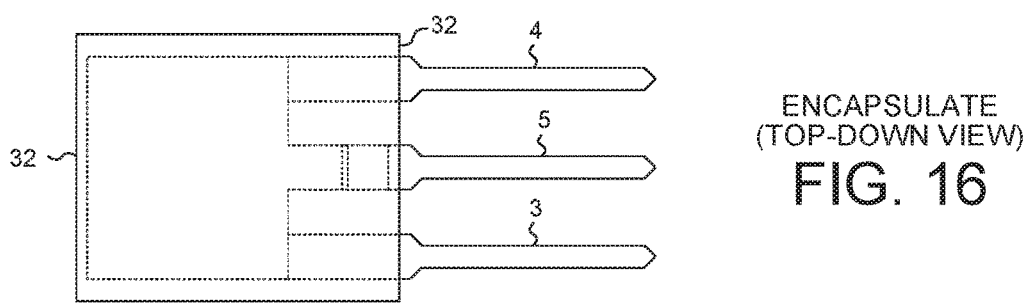
FIG. 16 is a top-down diagram that illustrates the structure after an encapsulation step.

FIG. 16 is a top-down diagram that illustrates a subsequent step in the assembly process. An amount of insulative encapsulant 32 is injection molded over the body portion of the assembly of FIG. 15.

Figure 17:
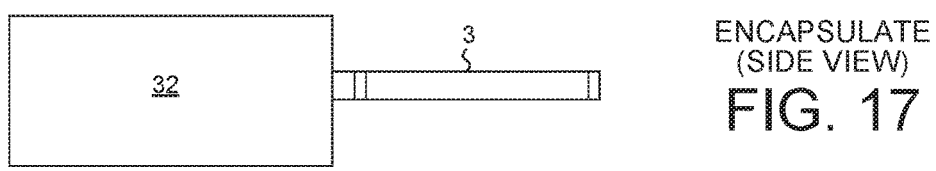
FIG. 17 is a side view diagram of the encapsulated structure of FIG. 16.

FIG. 17 is a side view diagram that illustrates the encapsulated assembly. After the injection molding, the encapsulant 32 has the shape illustrated in FIG. 1. The upper surface of the die backside contact member 25 is left exposed such that metal of the die backside contact member 25 forms a part of the outside surface of the body portion 2. Likewise, the bottom surface of the die bond pad portion 26 of the third lead 5 is left exposed such that metal of portion 26 forms a part of the outside surface of the body portion 2.

Figure 18:
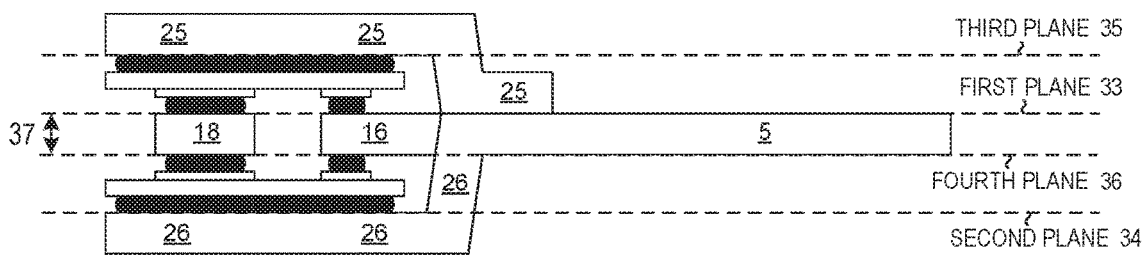
FIG. 18 is a cross-sectional diagram that illustrates planes in the first embodiment.

FIG. 18 is a cross-sectional view that illustrates a first plane 33, a second plane 34, a third plane 35, and a fourth plane 36. The planar top surfaces of the first, second and third leads 3-5 are all disposed in the first plane 33. The die attach surface of the die bond pad portion 26 is disposed in the second plane 34. The die attach surface of the die backside contact member 25 is disposed in the third plane 35. The first, second and third planes are parallel planes with respect to one another. The first plane is disposed between the second and third planes. The entire first lead 3 has a uniform thickness 37. The lead portions of the first and second leads also have this same uniform thickness. In particular example described here, the uniform thickness is less than one millimeter.

Figure 19:
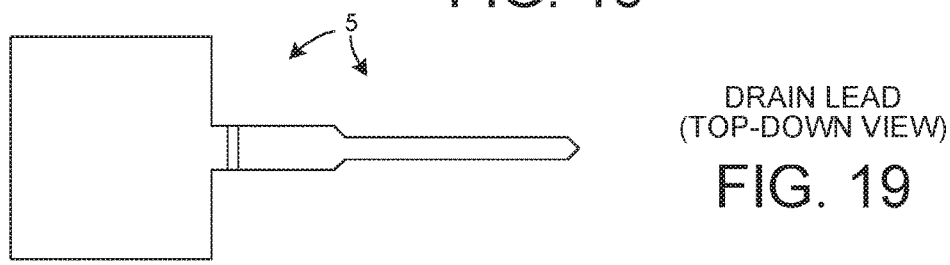
FIG. 19 is a top-down diagram of the third lead in accordance with a second embodiment of the packaged semiconductor device.
Figure 27:
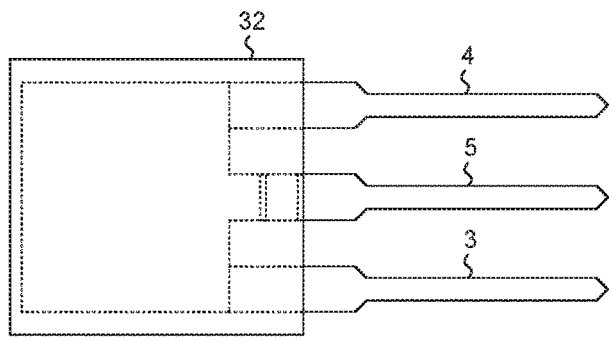
FIG. 27 is a top-down diagram that shows the structure of FIG. 25 after an amount of encapsulant has been injection molded in order to form a body portion.
Figure 28:
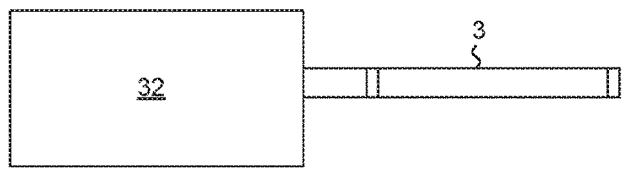
FIG. 28 is a side view diagram of the structure of FIG. 27.

FIGS. 19-28 are a sequence of drawings that illustrate a second embodiment and a second assembly method. In this embodiment and assembly method, there is no fork-shaped drain lead assembly. The method starts with the third lead 5. The third lead 5 is of the same shape and form as is used in the first embodiment. FIG. 19 shows the third lead 5 from the top-down perspective. FIG. 20 shows the third lead 5 from the side perspective. An amount of solder 38 is placed on the upward-facing die attach surface of the die bond pad portion 26 of the third lead 5. This solder 38 may be applied as a paste or as a preform. The assembly of FIG. 8 is made as described above in connection with the first embodiment. The assembly of FIG. 8 is then placed down onto the solder 38 as illustrated in FIG. 21. FIG. 22 shows the resulting assembly from the top-down perspective. The assembly is not heated at this point, but rather the die backside contact member 25 is placed down onto the assembly. FIG. 23 is a top-down diagram of the die backside contact member 25. FIG. 24 is a side view of the die backside contact member 25. This die backside contact member 25 is placed down onto the assembly of FIG. 22 from the top so that amount of solder 39 is disposed between the downward-facing die attach surface of the die backside contact member 25 and the upward-facing backside surface of the second die 11. Another amount of solder 40 is disposed between the bottom of the foot portion 29 of the die backside contact member 25 and the top surface of the third lead 5 as illustrated in FIG. 25. FIG. 26 is a top-down diagram of the resulting assembly. At this point in the assembly process, the three leads 3-5 are disposed so that they all extend parallel to one another. Typically the leads and the die backside contact member are parts of leadframes. The leadframes are held together by a bridge member. The assembly is then heated in an oven so that amounts of solder 39 and 40 liquefy. In this way the die backside contact member 25 is soldered to the backside surface of the second die 11 and to the third lead 5. The solder used to form the prior assembly of FIG. 8 may be an appropriate eutectic solder such that after the structure of FIG. 8 has been soldered together the melting point of the solder joint material increases. Due to this increased melting point, the solder joints of the prior assembly of FIG. 8 do not melt when the amounts of solder 39 and 40 melt in the second heating step of FIG. 25 and FIG. 26. After the structure of FIG. 25 has been soldered together, encapsulant 32 is injection molded to form the body portion 2 of the packaged semiconductor device 1. The finished packaged semiconductor device 1 has the form illustrated in FIG. 1. FIG. 27 is a top-down diagram of the finished packaged semiconductor device 1. The structures beneath the surface of the encapsulant are shown in dashed lines. FIG. 28 is a side view of the finished packaged semiconductor device 1.

FIGS. 29-40 are a sequence of drawings that illustrates a third embodiment and a third assembly method. In this third embodiment and assembly method, the first and second semiconductor device dice are not first soldered to the first and second leads, and then this subassembly is attached to the third lead. Rather, in this third embodiment there are two die backside contact members. The first semiconductor device die is mounted to the bottom die backside contact member. The second semiconductor device die is mounted to the top die backside contact member. The two die backside contact members, with their respective semiconductor device dice already attached, are then clamped onto a central set of leads from the top and bottom. The resulting structure is soldered together so that feet portions of this pair of top and bottom die backside contact members are bonded to the third lead. The resulting structure is then encapsulated to form an instance of the finished packaged semiconductor device.

Figure 29:
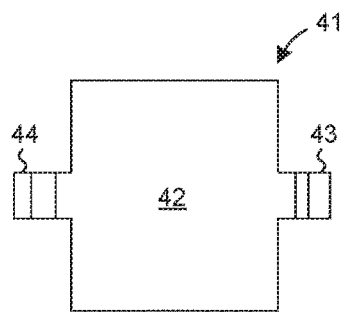
FIG. 29 is a top-down diagram of a top die backside contact member used in a third embodiment of the packaged semiconductor device.
Figure 31:
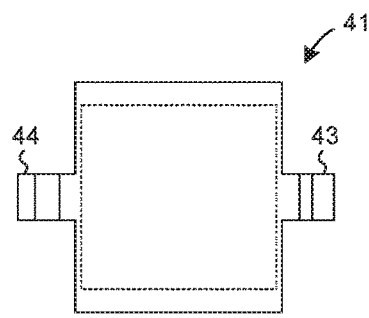
FIG. 31 is a top-down diagram that shows the top die backside contact member of FIG. 29 after the second semiconductor device die has been attached.
Figure 30:
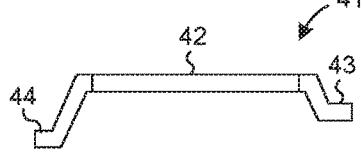
FIG. 30 is a side view diagram of the top die backside contact member of FIG. 29.
Figure 32:
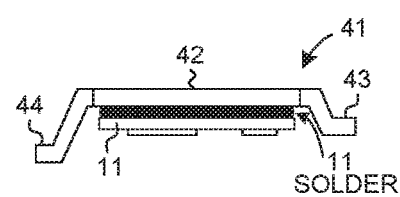
FIG. 32 is a side view diagram of the structure of FIG. 31.

FIG. 29 is a top-down diagram of a top die backside contact member 41. The top die backside contact member 41 has a central die bond pad portion 42 and two foot members 43 and 44. The top die backside contact member 41 has a planar die attach surface. FIG. 30 is a side view diagram of the top die backside contact member 41. In a first soldering step, the backside drain electrode surface of the second semiconductor device die 11 is mounted to the planar die attach surface of the top die backside contact member 41. In one example, the die 11 is mounted using an amount of soft solder 45. FIG. 31 is a top-down diagram of the resulting assembly. The contour of the second die 11 under the top die backside contact member 41 is shown in dashed lines. FIG. 32 is a side view diagram of the resulting assembly.

Figure 33:
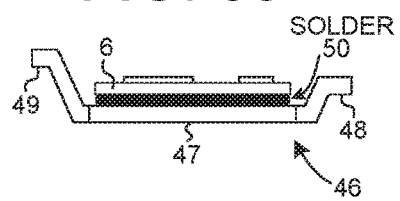
FIG. 33 is a side view diagram of the bottom die backside contact member after the first semiconductor device die has been attached.

In addition, there is a bottom die backside contact member 46. The bottom die backside contact member 46 is of the same form as the top die backside contact member. The bottom die backside contact member 46 has a central die bond pad portion 47 and two foot members 48 and 49. In the first soldering step, the backside drain electrode surface of the first semiconductor device die 6 is mounted to the planar die attach surface of the bottom die backside contact member 46 as shown in FIG. 33. In one example, the die 6 is mounted using an amount of soft solder 50.

Although a single top die backside contact member 41 is pictured in FIG. 32, the top die backside contact member 41 is actually part of a larger frame. The frame includes a number of identical top die backside contact members that are connected together by thin fingers of metal. The individual top die backside contact members can be singulated from the frame in single stamping/cutting step by cutting these fingers. Likewise, although a single bottom die backside contact member 46 is pictured in FIG. 33, the bottom die backside contact member 46 is part of a larger frame. The frame includes a number of identical bottom die backside contact members that can be singulated from the frame in single stamping/cutting step. Individual semiconductor device dice are mounted onto the planar die attach surfaces of corresponding die backside contact members of these frames.

Figure 34:
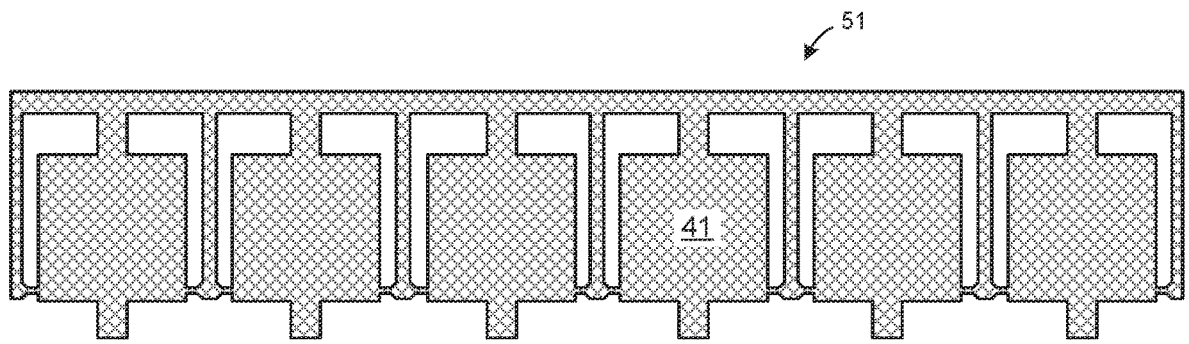
FIG. 34 is a top-down diagram of a frame of top die backside contact members.

FIG. 34 is a top-down diagram of one such frame 51 of die backside contact members. Six second semiconductor device dice are soldered to the bottomside of this frame. The attachment of the semiconductor device dice to these frames is the first soldering step.

Figure 35:
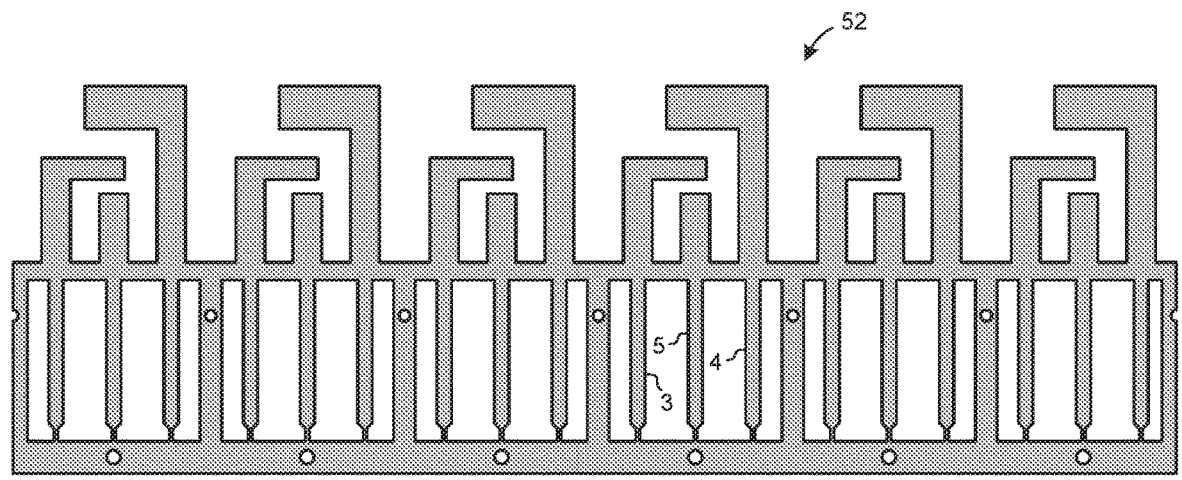
FIG. 35 is a top-down diagram of a leadframe of the first, second and third leads.

In addition to these two die backside contact member frame subassemblies, the third embodiment also involves a leadframe 52. Each separate portion of this leadframe 52 includes not just a first lead (gate lead) and a second lead (source lead), but rather the separate portion also includes a third lead (drain lead). Unlike the third leads used in the first and second embodiments, the third leads used in this third embodiment are not bent to have vertically displaced die attach surfaces with respect to the plane of the lead portions of the leads. Rather, the third leads used in this third embodiment are simply stamped from the same piece of flat sheet metal along with the first and second leads. FIG. 35 is a top-down diagram of the leadframe 52.

In a next step of the assembly method, the frame of top die backside contact members is placed onto the leadframe 52 from the top. An amount of solder is disposed between the each source pad of the top frame assembly and the die bond pad portion of each corresponding source lead. An amount of solder is disposed between each gate pad of the top frame assembly and the die bond pad portion of each corresponding gate lead. An amount of solder is disposed between the foot portion 43 of each top die backside contact member and the top surface of the corresponding third lead. Considering the particular top die backside contact member 41, these amounts of solder are identified in FIG. 37 by reference numerals 53, 54 and 55.

The frame of bottom die backside contact members is also placed onto the leadframe 52 from the bottom. An amount of solder is disposed between the each source pad of the bottom frame assembly and the die bond pad portion of each corresponding source lead. An amount of solder is disposed between each gate pad of the bottom frame assembly and the die bond pad portion of each corresponding gate lead. An amount of solder is disposed between the foot portion 48 of each bottom die backside contact member and the bottom surface of the corresponding third lead. Considering the particular bottom die backside contact member 46, these amounts of solder are identified in FIG. 37 by reference numerals 56, 57 and 58.

Figure 36:
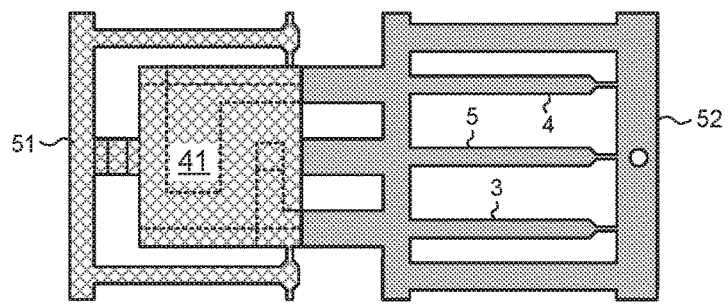
FIG. 36 is a top-down diagram that illustrates the two frames of die backside contact members sandwiching the leadframe from the top and bottom.
Figure 37:
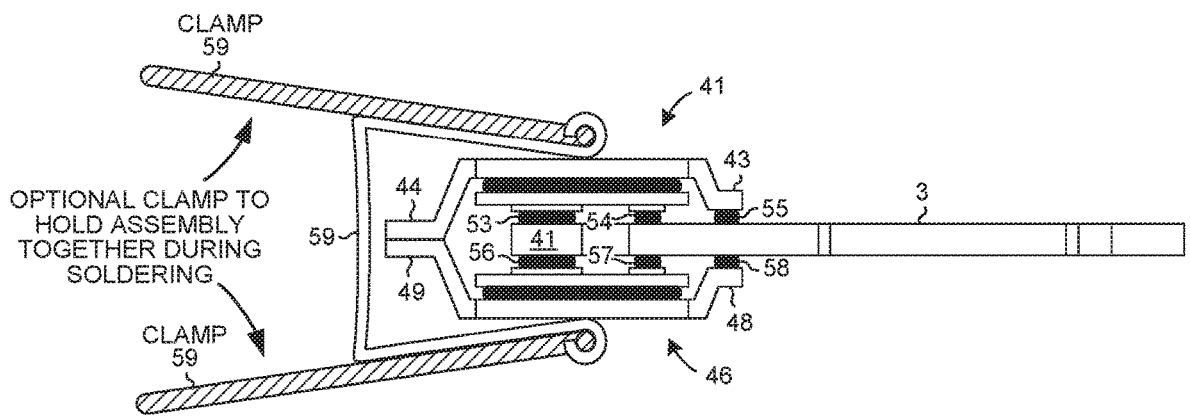
FIG. 37 is a side view diagram of the assembly of FIG. 36.
Figure 38:
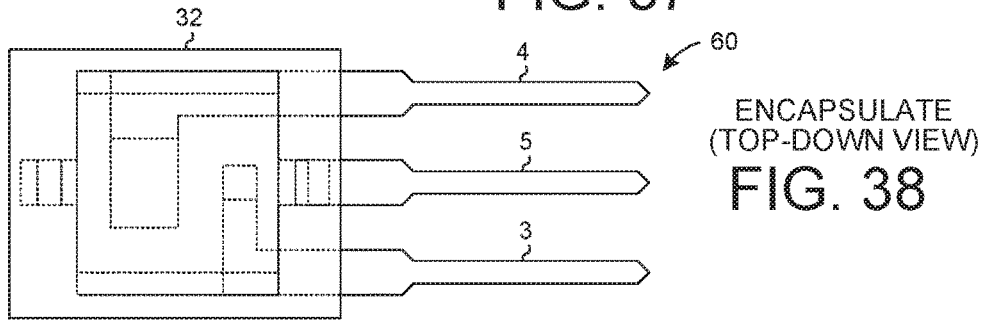
FIG. 38 is a top-down diagram that shows the result of an encapsulation step.
Figure 39:
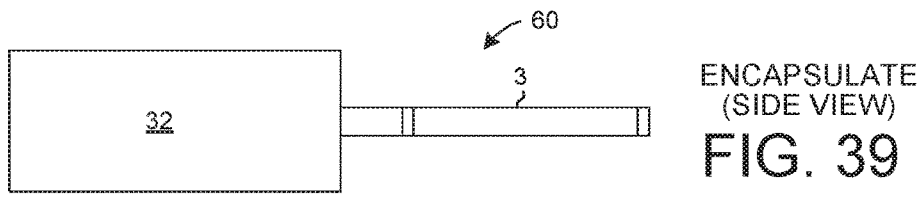
FIG. 39 is a side view diagram of the structure of FIG. 38.
Figure 40:
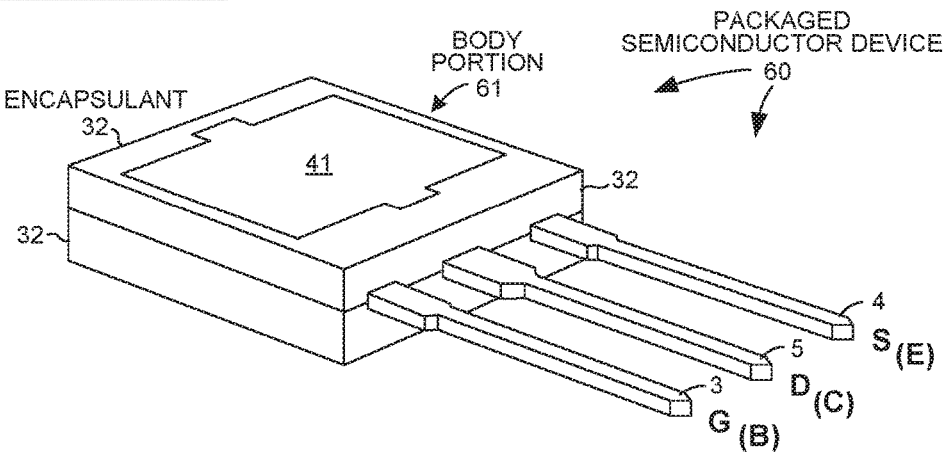
FIG. 40 is a perspective view diagram of the third embodiment of the packaged semiconductor device.

FIG. 36 is a top-down diagram that illustrates the two frames of die backside contact members sandwiching the leadframe 52 from the top and bottom. FIG. 37 is a diagram that shows a side view of the assembly. The two frames of die backside contact members may be held in this position by a clamp. One example of a clamp 59 is shown in FIG. 37. When the structures are in this position, the assembly is heated to liquefy the solder amounts 53-58. In this way, the top die backside contact member assembly is soldered to the leadframe 52 from the top, and the bottom die backside contact member assembly is soldered to the leadframe 52 from the bottom. This is referred to as the second soldering step. After the second soldering step, the clamp is removed. In a trimming step, the unwanted parts of the frames of top and bottom die backside contact members are cut away and removed. The leadframe 52 is left intact. The leadframe 52 is then used in a standard injection molding encapsulation step to form an array of body portions. The resulting structure is then singulated in a trimming step into a plurality of identical packaged semiconductor devices. FIG. 38 is a top-down diagram of one of the resulting packaged semiconductor devices 60. This is the particular device that includes the die backside contact members 41 and 46. Reference numeral 32 identifies the encapsulant of the body portion of this device 60. FIG. 39 is a side view diagram of the finished packaged semiconductor device 60. FIG. 40 is a perspective view of the finished packaged semiconductor device 60. The three leads 3-5 extend from the body portion 61. The outer metal surface of the top die backside contact member 41 is not covered by encapsulant, but rather forms a part of the outside surface of the packaged device 60. Although it cannot be seen from the perspective of FIG. 40, the outer metal surface of the bottom die backside contact member 46 is also not covered by encapsulant, but rather forms another part of the outside surface of the packaged device 60.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A method of making a packaged semiconductor device, wherein the packaged semiconductor device comprises a body portion, a first lead, a second lead and a third lead, wherein the first lead comprises a die bond pad portion and a lead portion, wherein the lead portion of the first lead extends along a first direction, wherein the second lead comprises a die bond pad portion and a lead portion, wherein the lead portion of the second lead extends along the first direction, and a third lead that has a lead portion, wherein the lead portion of the third lead is disposed between the lead portion of the first lead and the lead portion of the second lead;

wherein the method comprises:

(a) bonding a front side of a first semiconductor device die to the first lead and to the second lead such that a gate pad of the first semiconductor device die is bonded to the first lead and such that a source pad of the first semiconductor device die is bonded to the second lead;

(b) bonding a front side of a second semiconductor device die to the first lead and to the second lead such that a gate pad of the second semiconductor device die is bonded to the first lead and such that a source pad of the second semiconductor device die is bonded to the second lead, wherein the bonding of (a) and (b) are performed such that the front sides of the first and second semiconductor device dice face each other with a portion of the first lead and a portion of the second lead being disposed therebetween; wherein the die bond pad portion of the first lead has a first distal end extending at an angle toward the second lead and is disposed a first distance along the first direction, and wherein the die bond pad portion of the second lead has a second distal end extending at an angle toward the first lead and is disposed a second distance along the first direction, different from the first distance; wherein the source pad of the first semiconductor device is spaced apart from the gate pad of the first semiconductor device along the first direction; wherein the source pad of the second semiconductor device is spaced apart from the gate pad of the second semiconductor device along the first direction;

(c) electrically coupling a drain electrode on the backside of the first semiconductor device die to the third lead;

(d) electrically coupling a drain electrode on the backside of the second semiconductor device die to the third lead; and (e) providing an amount of encapsulant such that the first and second semiconductor device dice and the amount of encapsulant together form a part of the body portion of the packaged semiconductor device, wherein the amount of encapsulant is provided in (e) such that the first lead, the second lead, and the third lead extend out of the body portion parallel to one another.

2. The method of claim 1, wherein the lead portion of the first lead, the lead portion of the second lead, and the lead portion of the third lead extend out of the body portion parallel to one another.

3. The method of claim 1, wherein the third lead further comprises: a first tine portion, wherein the first tine portion has a die attach surface that is bonded to the backside of the first semiconductor device die; and a second tine portion, wherein the second tine portion has a die attach surface that is bonded to the backside of the second semiconductor device die, wherein both the first and second semiconductor device dice are disposed between the first and second tine portions.

4. The method of claim 3, wherein the first tine portion is comprised entirely of metal, and wherein the second tine portion is comprised entirely of metal.

5. The method of claim 1, wherein the packaged semiconductor device comprises no bondwires.

6. The method of claim 1, wherein the first semiconductor device die and the second semiconductor device die extend parallel to a main plane, and wherein the first lead has a uniform thickness, wherein the second lead has the same uniform thickness, wherein the lead portion of the third lead also has the same uniform thickness, wherein the uniform thickness is a thickness taken in a direction perpendicular to the main plane, and wherein the uniform thickness is less than one millimeter.

7. The method of claim 1, wherein the first lead is a first piece of stamped unitary sheet metal, and wherein the second lead is a second piece of stamped unitary sheet metal.

* * * * *